United States Patent
Stellari et al.

(10) Patent No.: US 7,239,157 B2
(45) Date of Patent: Jul. 3, 2007

(54) OPTICAL TRIGGER FOR PICA TECHNIQUE

(75) Inventors: Franco Stellari, Ho Ho Kus, NJ (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/098,850

(22) Filed: Apr. 5, 2005

(65) Prior Publication Data
US 2006/0220664 A1    Oct. 5, 2006

(51) Int. Cl.
*G01R 31/302* (2006.01)
(52) U.S. Cl. .................................... 324/752
(58) Field of Classification Search ............ None
See application file for complete search history.

(56) References Cited

U.S. PATENT DOCUMENTS 5,327,782 A * 7/1994 Sato et al. ............... 73/129
6,459,844 B1 * 10/2002 Pan ........................ 385/140
6,859,031 B2 * 2/2005 Pakdaman et al. ......... 324/233
6,952,107 B2 * 10/2005 Rahmatian ................ 324/753

\* cited by examiner

*Primary Examiner*—Ha Tran Nguyen
*Assistant Examiner*—Trung Q. Nguyen
(74) *Attorney, Agent, or Firm*—Duke W. Yee; Anne V. Dougherty; Gerald H. Glanzman

(57) ABSTRACT

Optical triggering system and method for synchronizing a test of an integrated circuit chip with its operation. An optical triggering system includes a testing mechanism, such as a PICA testing mechanism, for testing an integrated circuit chip. An optical trigger mechanism generates an optical trigger signal for synchronizing a test of the integrated circuit chip with its operation. The optical trigger mechanism provides an optical trigger signal having reduced jitter and a higher frequency rate than an electrical trigger signal resulting in a more accurate test of the integrated circuit chip.

9 Claims, 4 Drawing Sheets

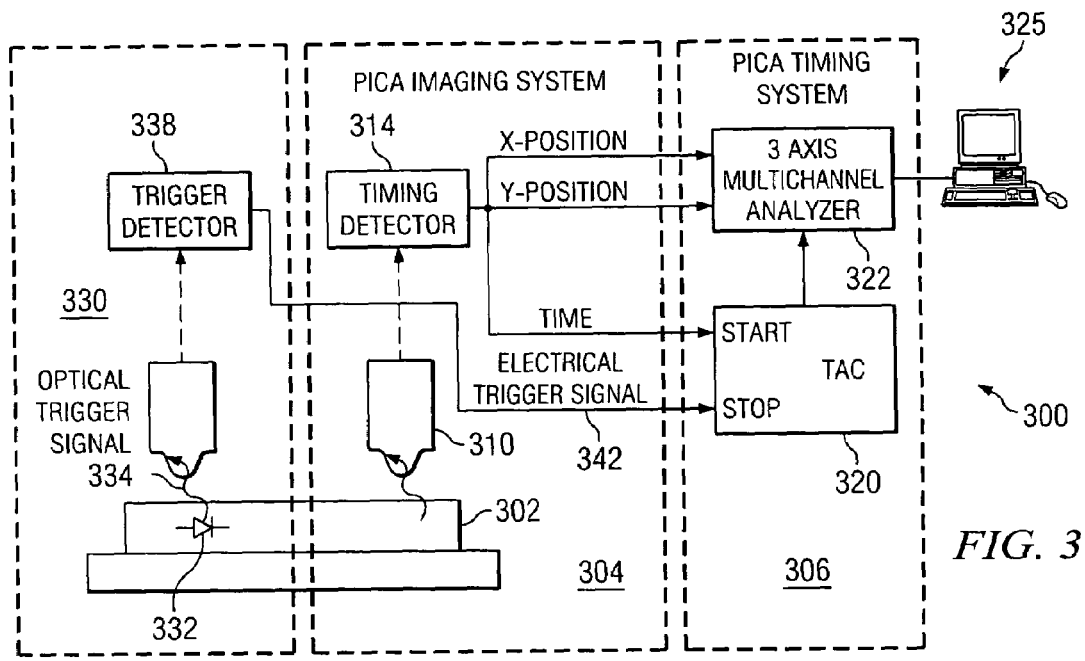
FIG. 3
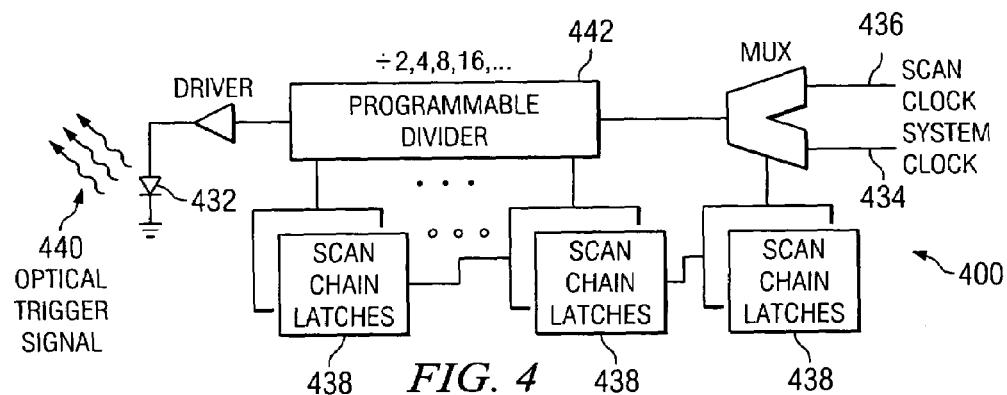
FIG. 4
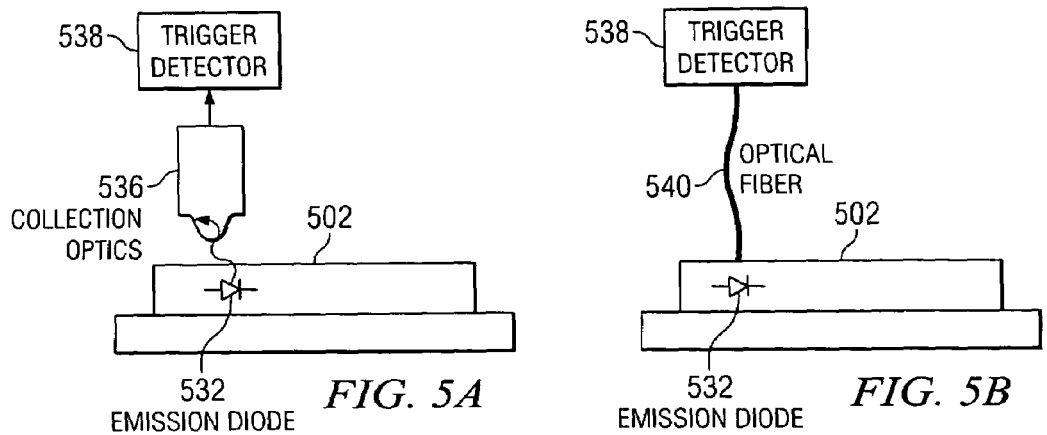

OPTICAL TRIGGER FOR PICA TECHNIQUE

BACKGROUND OF THE INVENTION

1. Technical Field

The present invention relates generally to the testing of integrated circuit chips and, more particularly, to an optical triggering system and method for synchronizing the optical test of an integrated circuit chip with its operation.

2. Description of Related Art

The Picosecond Imaging Circuit Analysis (PICA) technique is widely used to test modem integrated circuit chips due to its low invasiveness and high time resolution. The PICA testing technique is based on the collection of near infrared (NIR) light emitted by hot-carriers in the transistor channel of the chip, and has been demonstrated to be an invaluable method for detecting timing-related faults in backside-packaged Ultra Large Scale Integration (ULSI) circuits. Many innovative applications of the PICA technique have been developed in past years based on the detection of light emission due to off-state leakage current, oxide tunneling current and carrier recombination, thus leading to new application areas and more contributions to quick turn around times for circuit debugging and defect isolation.

Because of the important advantages offered by the PICA technique over other testing methods, which are often invasive and may lead to damage of the chip under test (CUT), a significant amount of effort has been devoted in recent years to the development of innovative detectors to compensate for the challenges related to the continuous reduction in voltage and size of modem ULSI circuits. Two detectors that have demonstrated significantly improved quantum efficiency (QE) in the NIR region of the spectrum are the Superconducting Single-Photon Detector (SSPD) and the InGaAs Avalanche Photo-Diode (APD) which offer a single-point detection capability. A third detector, the MEPSICRON Photo-Multiplier Tube marketed by Quantar Technology Incorporated of Santa Cruz, Calif., provides an imaging capability; and, in fact, permits the parallel acquisition of waveforms from hundreds of transistors in the same field of view.

Besides reduced emission intensity, modem ULSI circuits also provide a challenge related to the timing performance required to construct the optical signals emitted by the circuit during normal operation. A measure of such a capability is the Full-Width at Half Maximum (FWHM) of the detected optical signal when an ideal light impulse is emitted by the circuit (the larger the FWHM, the worse the timing performance). The FWHM of certain measurements is given by the quadratic sum of many different components ranging from detector resolution, front-end jitter, circuit jitter, optical signal dispersion, etc.

Fundamental for the PICA testing technique is the extraction of a trigger signal, synchronous with the operation of the integrated circuit that is used to reconstruct the histogram of the photon arrival time. Any jitter in the trigger signal, compared to the integrated circuit, limits the timing performances of the measurements. In particular, in the PICA testing system, there is an electrical connection between the PICA system and the CUT along the trigger path. When a high speed electrical trigger signal is extracted from the chip, it may be affected by jitter comparable with that of the detector (~50-ps FWHM) used in the PICA system; thus limiting final resolution. This limitation is due mainly to the resistive/capacitive load and quality of the electrical connection between the chip and the PICA system along the trigger path. Also, for some PICA applications, an electrical trigger signal cannot always be obtained from the CUT.

There is, accordingly, a need for a triggering mechanism for synchronizing the test of an integrated circuit chip with its operation that has reduced jitter and a higher frequency rate resulting in a more accurate test of the integrated circuit chip.

SUMMARY OF THE INVENTION

The present invention provides an optical triggering system and method for synchronizing a test, for example, a PICA test, of an integrated circuit chip with its operation. An optical triggering system according to the invention includes a testing mechanism, such as a PICA testing mechanism, for testing an integrated circuit chip. An optical trigger mechanism generates an optical trigger signal for synchronizing a test of the integrated circuit chip with its operation. The optical trigger mechanism provides an optical trigger signal having reduced jitter and a higher frequency rate than an electrical trigger signal resulting in a more accurate test of the integrated circuit chip.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 3 is a block diagram that schematically illustrates a PICA testing mechanism for testing integrated circuit chips according to a preferred embodiment of the present invention;

FIG. 4 is a schematic of control circuitry for controlling the light emission device included in the PICA testing mechanism illustrated in FIG. 3 according to a preferred embodiment of the present invention;

FIGS. 5A, 5B and 5C are block diagrams that schematically illustrate mechanisms for optically coupling the on-chip light emission device and the external optical trigger detector in the PICA testing mechanism illustrated in FIG. 3 according to preferred embodiments of the present invention;

DETAILED DESCRIPTION OF THE PREFERRED EMBODIMENTS

The Picosecond Imaging Circuit Analysis (PICA) technique, based on the collection of near-infrared (NIR) light emitted by hot-carriers in the transistor channel during switching transitions of individual gates, is widely used to test modem integrated circuits such as Very Large Scale Integration (VLSI) circuits. The PICA technique is a non-invasive optical method wherein a chip under test (CUT) is tested through its input/output (I/O) pins. The technique has been extensively utilized to evaluate propagation delays, clock skews, pulse widths and slopes.

Figure 1:
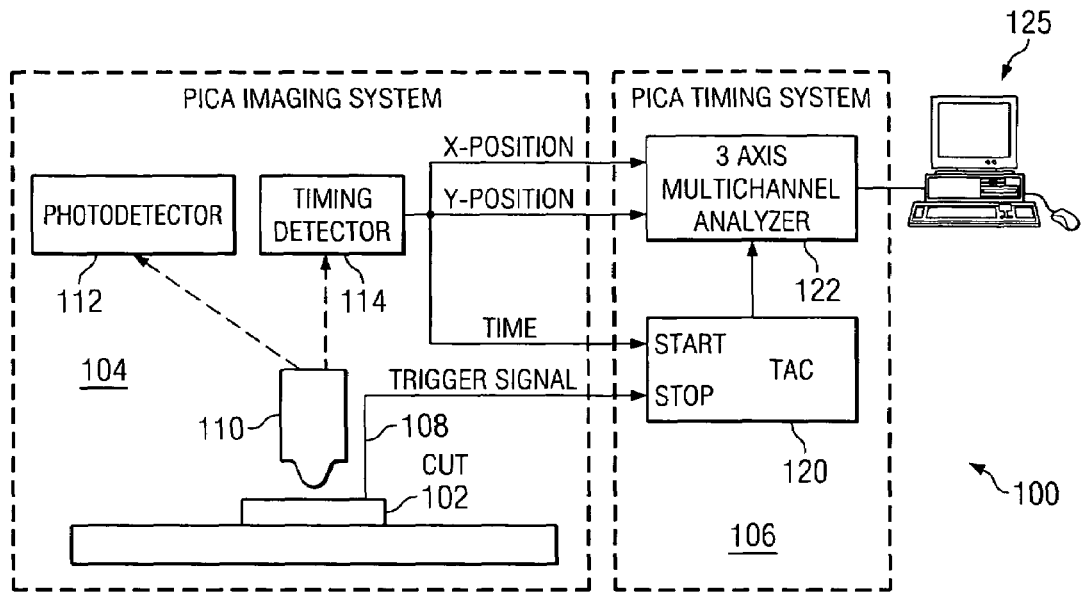
FIG. 1 is a block diagram that schematically illustrates a PICA testing mechanism for testing integrated circuit chips that is known in the art to assist in explaining the present invention.

With reference to FIG. 1, a block diagram that schematically illustrates a PICA testing mechanism for testing integrated circuit chips that is known in the art is depicted to assist in explaining the present invention. The PICA testing mechanism is generally designated by reference number 100, and is adapted to test an integrated circuit chip designated as chip under test (CUT) 102. PICA testing mechanism 100 includes PICA imaging system 104 and PICA timing system 106. PICA imaging system 104 includes collection optics 110, static detector 112 and timing detector 114 or any combination of the two types of detectors. Collection optics 110 comprises a lens system having one or more lenses, and static detector 112 comprises a time-integrated photodetector such as a Charge Coupled Device (CCD). Timing detector 114 can, for example, be a MEPSICRON Photo-Multiplier Tube marketed by Quantar Technology Incorporated of Santa Cruz, Calif., or a single pixel detector such as the Superconducting Single-Photon Detector (SSPD), or an Avalanche Photo Diode (APD) of various materials such as InGaAs, Ge, Si, etc. PICA timing system 106 includes time-to-amplitude converter (TAC) 120 and multichannel analyzer 122.

To conduct a test of CUT 102, the CUT is stimulated through a tester not shown, and the light emission from CUT 102 is collected by collection optics 110 and focused onto one of the detectors 112 or 114. When using timing detector 114, the timing and spatial information from CUT 102 is sent to PICA timing system 106 where TAC 120 and multichannel analyzer 122 are used to analyze the arriving photons. As shown in FIG. 1, the analysis is performed and the results output to a user by a data processing system schematically illustrated at 125.

Figure 2A:
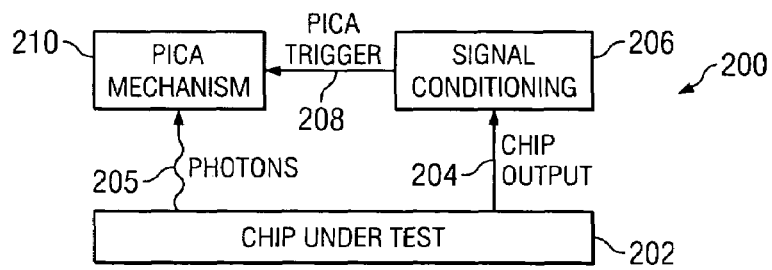
FIGS. 2A and 2B are block diagrams that schematically illustrate known trigger mechanisms for synchronizing a test of an integrated circuit chip with its operation by a PICA testing mechanism, such as the PICA testing mechanism illustrated in FIG. 1, to assist in explaining the present invention.
Figure 2B:
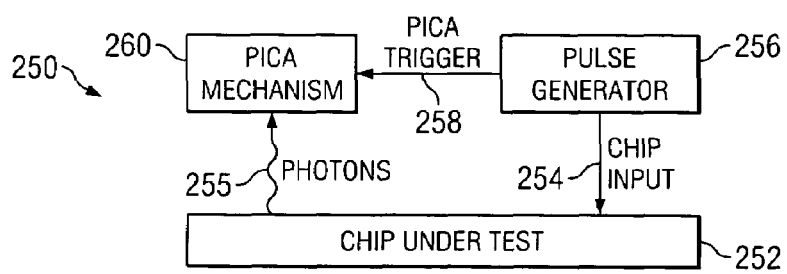

Fundamental to the PICA technique is the provision of a trigger signal, illustrated at 108, that is synchronous with the operation of the integrated circuit under test that is used to reconstruct a histogram of the photon arrival time. FIGS. 2A and 2B are block diagrams that schematically illustrate known trigger mechanisms for synchronizing a test of an integrated circuit chip with its operation by a PICA testing mechanism, such as the PICA testing mechanism 100 illustrated in FIG. 1, to assist in explaining the present invention. In particular, in trigger mechanism 200 illustrated in FIG. 2A, electrical output 204 of chip under test 202, synchronous with its operation, is used to provide PICA trigger signal 208 to trigger PICA mechanism 210 via signal conditioner 206; and, therefore, reconstruct the histogram of the photon arrival time as schematically illustrated at 205. In trigger mechanism 250 in FIG. 2B, external pulse generator/oscillator 256 triggers both CUT 252 by chip input signal 254 and PICA mechanism 260 by PICA trigger signal 258 to reconstruct the histogram of the photon arrival time as schematically illustrated at 255.

Trigger mechanisms 200 and 250 illustrated in FIGS. 2A and 2B are based on conventional electrical connections between the PICA testing mechanism and a CUT. In particular, trigger mechanisms 200 and 250 both comprise electrical trigger circuits that provide an electrical trigger signal path between the PICA testing mechanism and the CUT. In trigger mechanism 200, the electrical trigger signal to initiate a PICA measurement is extracted from the CUT by means of one of its I/Os, whereas in trigger mechanism 250, an external pulse generator electrically triggers both the PICA mechanism and the CUT, using one of the CUT's I/Os.

Electrical trigger mechanisms such as trigger mechanisms 200 and 250 are affected by similar issues that cause an increase in jitter. The slower the CUT I/Os, the more jitter that is introduced by the I/O driver/buffers. These issues are becoming progressively more important due to the increase of the clock frequency, which reduces the clock period and, therefore, the capability of separating peaks with a low jitter.

The present invention provides an optical triggering system and method for synchronizing a test of an integrated circuit chip with the operation of the chip, by, for example, a PICA testing mechanism, which avoids/reduces problems related to the use of an electrical trigger mechanism. In particular, the present invention provides an optical trigger circuit that utilizes an optical connection/link between a PICA testing mechanism and a CUT rather than an electrical connection. According to the present invention, rather than a trigger signal going into or out of a CUT through one of its I/Os, a trigger signal is exchanged optically between the CUT and the PICA testing mechanism.

FIG. 3 is a block diagram that schematically illustrates a PICA testing mechanism for testing integrated circuit chips according to a preferred embodiment of the present invention. The PICA testing mechanism is generally designated by reference number 300, and a CUT to be tested by PICA testing mechanism 300 is generally designated by reference number 302. In general, corresponding components of PICA mechanism 100 in FIG. 1 and PICA mechanism 300 in FIG. 3 are identified by corresponding reference numbers.

FIG. 3 also illustrates an optical trigger mechanism, generally designated by reference number 330, for providing a trigger signal to synchronize a test of CUT 302 with its operation by PICA testing mechanism 300. In optical trigger mechanism 330, an optical trigger signal is generated by CUT 302, collected externally, and converted to an electrical trigger signal to initiate a test by PICA testing mechanism 300. In particular, optical trigger mechanism 330 includes light emission device 332 in CUT 302 for emitting optical trigger signal 334. Preferably, light emission device 332 is a diode or a transistor that has been incorporated into the design of CUT 302 and is already present on the chip. Light emission device 332 is controlled by suitable control electronics such as control electronics 400 illustrated in FIG. 4. In particular, FIG. 4 is a schematic of control circuitry 400 for controlling the light emission device included in the PICA testing mechanism illustrated in FIG. 3 according to a preferred embodiment of the present invention.

As shown in FIG. 4, light emission diode 432, corresponding to light emission diode 332 in FIG. 3, is connected to a system clock 434 or to test clocks 436 by a scan chain-based design schematically illustrated at 438. In this way, emission diode 432 will emit light pulses 440 synchronously with the selected frequency. A divider 442 can be used to reduce the frequency of the light pulses.

Figure 5C:
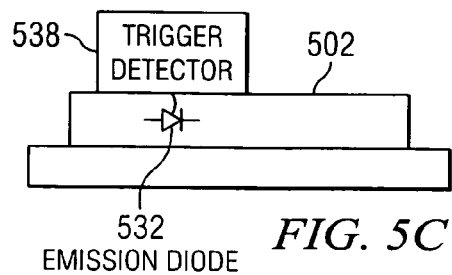

Returning back to FIG. 3, light 334 emitted by light emission device 332 in CUT 302 is detected by single point detector (diode) 338 and used to trigger PICA mechanism 300 after being converted to electrical trigger signal 342. Different mechanisms can be used to couple on-chip light emission device 332 and external detector 338. FIGS. 5A, 5B and 5C are block diagrams that schematically illustrate mechanisms for optically coupling the on-chip light emission device and the external optical trigger detector in the PICA testing mechanism illustrated in FIG. 3 according to preferred embodiments of the present invention In FIG. 5A, the optical coupling mechanism includes collection optics 536 for imaging light emitted by light emission diode 532 onto trigger detector 538 (this coupling mechanism is also illustrated in FIG. 3 by collection optics 336). In FIG. 5B, the optical coupling mechanism includes optical fiber 540 for optically coupling light emission diode 532 and trigger detector 538. In FIG. 5C, the optical coupling mechanism comprises positioning trigger detector 538 in direct contact with or in close proximity to light emission diode 532.

Figure 6:
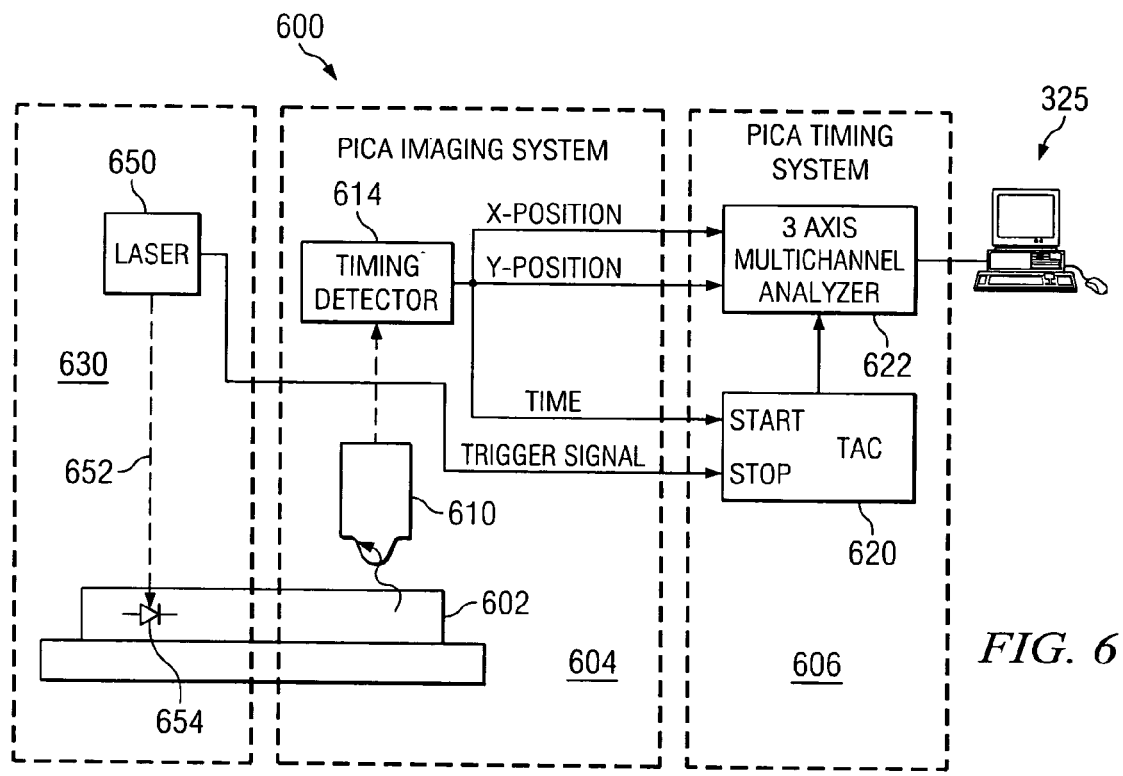
FIG. 6 is a block diagram that schematically illustrates a PICA testing mechanism for testing integrated circuit chips according to a preferred embodiment of the present invention.

FIG. 6 is a block diagram that schematically illustrates a PICA testing mechanism for testing integrated circuit chips according to a preferred embodiment of the present invention. The PICA testing mechanism is generally designated by reference number 600, and the CUT to be tested is designated by reference number 602. Corresponding components of PICA mechanism 100 in FIG. 1 and PICA mechanism 600 in FIG. 6 are identified by corresponding reference numbers.

FIG. 6 also illustrates an optical trigger mechanism, generally designated by reference number 630, for providing a trigger signal to initiate a test of CUT 602 by PICA testing mechanism 600. Optical trigger mechanism 630 includes an external pulsed laser 650 for shooting a short light pulse 652 onto detection diode 654 in CUT 602 to trigger/activate an electrical behavior such as a clock advancement step, switch a semaphore circuit, or trigger an operation or subcircuit. A trigger for initiating a test by PICA system 600 is derived directly from laser 650. For example, the output of laser 650 could be detected by an avalanche photodiode (APD) and its front-end electronics; and the corresponding output electrical signal can be used as a clock, etc.

Figure 7:
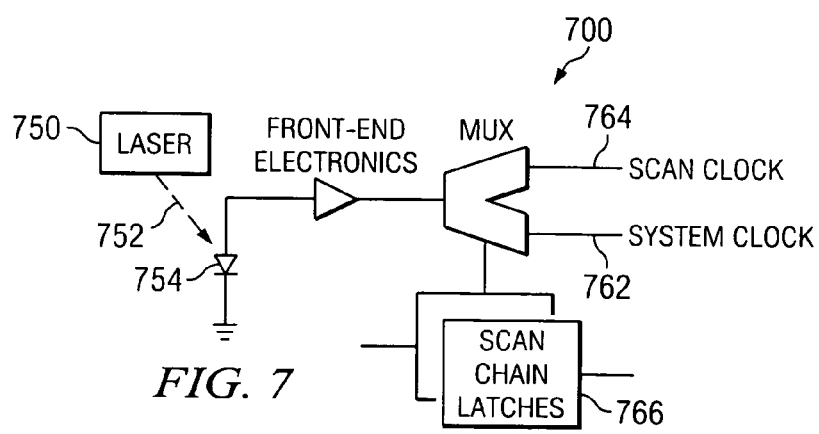
FIG. 7 is a schematic of control circuitry for providing a trigger signal for synchronizing a test of an integrated circuit chip with its operation by the PICA testing mechanism illustrated in FIG. 6 according to a preferred embodiment of the present invention.

FIG. 7 is a schematic of control circuitry 700 for providing a trigger signal for initiating a test of a circuit under test by PICA testing mechanism 600 illustrated in FIG. 6 according to a preferred embodiment of the present invention. In particular, as shown in FIG. 7, laser beam/pulse 752, corresponding to laser beam/pulse 652 in FIG. 6, is sent from laser 750 to detection diode 754, which is connected to system clock 762 or to test clocks 764 by a scan chain-based design schematically illustrated at 766. In this way, laser 650 or 750 will emit light pulses 652 or 752 synchronously with the selected frequency that will be detected by detection diode 654 or 754.

Figure 8A:
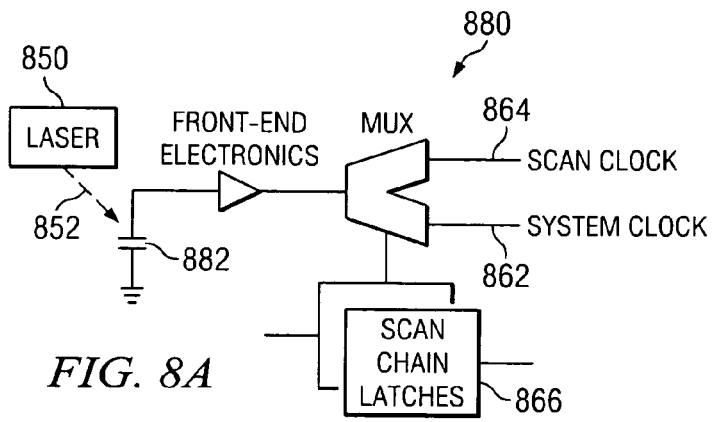
FIGS. 8A and 8B are schematics of control circuitry for providing a trigger signal for synchronizing a test of an integrated circuit chip with its operation by the PICA testing mechanism illustrated in FIG. 6 according to further preferred embodiments of the present invention.
Figure 8B:
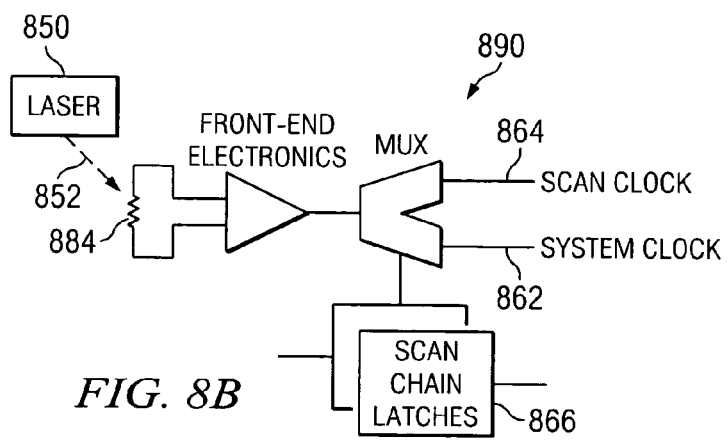

Photo-carrier generation mechanisms can also be used to activate an electronic switch such as a floating gate transistor, or to increase the conductibility of a resistor, etc. FIGS. 8A and 8B are block diagrams of control circuitry for providing a trigger signal for synchronizing a test of an integrated circuit chip with its operation by PICA testing mechanism 600 illustrated in FIG. 6 according to further preferred embodiments of the present invention. In control circuitry 880 illustrated in FIG. 8A, photo-carriers change the potential of capacitor 882. In control circuitry 890 illustrated in FIG. 8B, photo-carriers change the value of resistor 884.

Figure 9A:
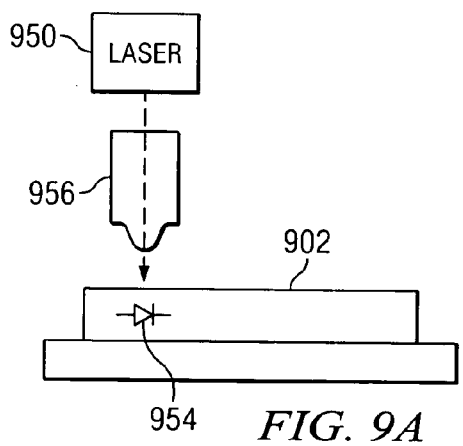
FIGS. 9A and 9B are block diagrams that schematically illustrate mechanisms for optically coupling the on-chip light emitting device and the external optical trigger detector in the PICA testing mechanism illustrated in FIG. 6 according to preferred embodiments of the present invention.
Figure 9B:
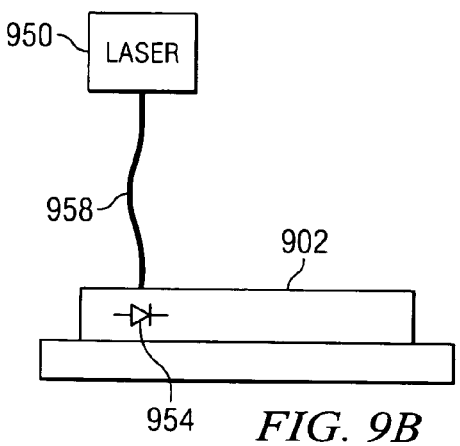

FIGS. 9A and 9B are block diagrams that schematically illustrate mechanisms for optically coupling the on-chip light emitting device and the external optical trigger detector in PICA testing mechanism 600 illustrated in FIG. 6 according to preferred embodiments of the present invention. In FIG. 9A, collection optics 956 is used to direct light emitted by laser 950 onto detector or electronic switch 954 in CUT 902. In FIG. 9B, optical fiber 958 directs light emitted by laser 950 onto detector or electronic switch 954 in CUT 902.

Figure 10:
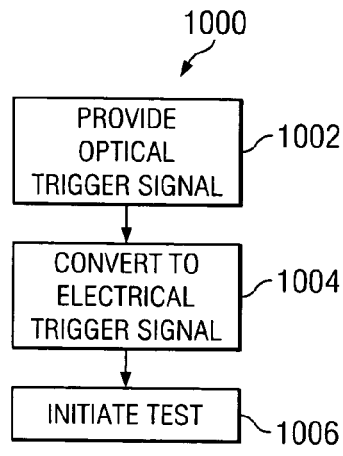
FIG. 10 is a flowchart that illustrates a method for synchronizing a test of an integrated circuit chip with its operation by a PICA testing mechanism according to a preferred embodiment of the present invention.

FIG. 10 is a flowchart that illustrates a method for synchronizing a test of an integrated circuit chip with its operation by a PICA testing mechanism according to a preferred embodiment of the present invention. The method is generally designated by reference number 1000, and begins by providing an optical trigger signal (Step 1002). The optical trigger signal is then converted to an electrical trigger signal (Step 1004), and the electrical trigger signal is used to initiate a test of a CUT by a PICA testing mechanism (Step 1006).

The present invention thus provides an optical triggering system and method for synchronizing a test of an integrated circuit chip with its operation. An optical triggering system according to the invention includes a chip under test and a testing mechanism, such as a PICA testing mechanism, for testing the chip under test. An optical trigger mechanism generates an optical trigger signal for synchronizing a test of the chip under test with its operation. The optical trigger mechanism provides an optical trigger signal having reduced jitter and a higher frequency rate than an electrical trigger signal resulting in a more accurate test of the integrated circuit chip.

The description of the present invention has been presented for purposes of illustration and description, and is not intended to be exhaustive or limited to the invention in the form disclosed. Many modifications and variations will be apparent to those of ordinary skill in the art. For example, although the invention has been described primarily in connection with a PICA testing mechanism for testing integrated circuit chips, the invention can also be used to initiate testing by other types of testing mechanisms. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system for synchronizing a test of an integrated circuit chip with its operation, comprising:
   a testing mechanism for testing the integrated circuit chip; and an optical trigger mechanism for generating an optical trigger signal for synchronizing a test of the integrated circuit chip with its operation for testing by the testing mechanism, wherein the optical trigger mechanism includes:
a light emission device external of the integrated circuit chip for generating the optical trigger signal; and
a light detection device on the integrated circuit chip and responsive to detecting the optical trigger signal generated by the external light emission device for synchronizing a test of the integrated circuit chip with its operation.

2. The system according to claim 1, wherein the light emission device comprises a laser.

3. The system according to claim 1, wherein the light detection device comprises a light detection diode.

4. The system according to claim 1, and further including a light transmission mechanism for transmitting the optical trigger signal to the light detection device.

5. The system according to claim 4, wherein the light transmission mechanism comprises one of collection optics and an optical fiber.

6. The system according to claim 1, wherein the testing mechanism comprises a PICA testing mechanism.

7. A method for testing an integrated circuit chip, comprising:
providing a testing mechanism for testing an integrated circuit chip;
generating an optical trigger signal externally of the integrated circuit chip for synchronizing a test of the integrated circuit chip with its operation for testing by the testing mechanism; and
detecting the optical trigger signal on the integrated circuit chip.

8. The method according to claim 7, and further including:
transmitting the optical trigger signal from an external light emission device to a light detection device on the integrated circuit chip.

9. The method according to claim 8, wherein transmitting the optical trigger signal from an external light emission device to a light detection device on the integrated circuit chip comprises:
transmitting the optical trigger signal from the external light emission device to the light detection device on the integrated circuit chip using one of collection optics and an optical fiber.

* * * * *